United States Patent
Lim et al.

(10) Patent No.: US 10,338,706 B2
(45) Date of Patent: Jul. 2, 2019

(54) CONDUCTIVE STRUCTURE BODY PRECURSOR, CONDUCTIVE STRUCTURE BODY AND METHOD FOR MANUFACTURING THE SAME

(71) Applicant: LG CHEM, LTD., Seoul (KR)

(72) Inventors: Jin Hyong Lim, Daejeon (KR); Yong Chan Kim, Daejeon (KR); Junghwan Yoon, Daejeon (KR); Jung Il Yoon, Daejeon (KR); Ki-Hwan Kim, Daejeon (KR); Ilha Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 508 days.

(21) Appl. No.: 14/765,737

(22) PCT Filed: Nov. 27, 2014

(86) PCT No.: PCT/KR2014/011498
§ 371 (c)(1),
(2) Date: Aug. 4, 2015

(87) PCT Pub. No.: WO2015/080496
PCT Pub. Date: Jun. 4, 2015

(65) Prior Publication Data
US 2015/0370359 A1    Dec. 24, 2015

(30) Foreign Application Priority Data
Nov. 27, 2013    (KR) .................. 10-2013-0145567

(51) Int. Cl.
*G06F 1/16*    (2006.01)
*H05K 1/02*    (2006.01)
(Continued)

(52) U.S. Cl.
CPC ............ *G06F 3/041* (2013.01); *G06F 1/16* (2013.01); *H01L 31/022466* (2013.01); *H01L 31/022475* (2013.01); *H01L 31/022483* (2013.01); *H05K 1/0296* (2013.01); *H05K 1/09* (2013.01); *H05K 3/0017* (2013.01); *H05K 3/022* (2013.01); *G06F 2203/04103* (2013.01); *H05K 1/0274* (2013.01); *H05K 2201/0108* (2013.01); *H05K 2201/0326* (2013.01); *H05K 2203/0315* (2013.01); *H05K 2203/105* (2013.01); *H05K 2203/1105* (2013.01); *H05K 2203/1545* (2013.01)

(58) Field of Classification Search
None
See application file for complete search history.

(56) References Cited

U.S. PATENT DOCUMENTS 9,101,059 B2    8/2015  Kim et al.
9,428,625 B2    8/2016  Nashiki et al.
(Continued)

FOREIGN PATENT DOCUMENTS

CN    102544070 A    7/2012
EP    2629308 A2    8/2013
(Continued)

*Primary Examiner* — Nitin Patel
*Assistant Examiner* — Amen Bogale
(74) *Attorney, Agent, or Firm* — Dentons US LLP (57) ABSTRACT

The present application provides a conductive structure body precursor, a conductive structure body and a method for manufacturing the same.

6 Claims, 6 Drawing Sheets

(51) Int. Cl.
*H05K 1/09* (2006.01)
*H05K 3/00* (2006.01)
*H05K 3/02* (2006.01)
*G06F 3/041* (2006.01)
*H01L 31/0224* (2006.01)

(56) References Cited

U.S. PATENT DOCUMENTS

| | | | |
|---|---|---|---|
| 2002/0071934 A1* | 6/2002 | Marutsuka | H01J 11/10 428/131 |
| 2009/0104440 A1 | 4/2009 | Nashiki et al. | |
| 2012/0114923 A1* | 5/2012 | Haishi | C23C 14/086 428/213 |
| 2012/0146042 A1 | 6/2012 | Kim et al. | |
| 2012/0273344 A1 | 11/2012 | Nashiki et al. | |
| 2013/0105301 A1 | 5/2013 | Yamazaki et al. | |
| 2013/0157070 A1* | 6/2013 | Fujino | H01B 7/04 428/469 |
| 2013/0243945 A1 | 9/2013 | Fujino et al. | |
| 2013/0248227 A1 | 9/2013 | Kim et al. | |
| 2013/0280554 A1 | 10/2013 | Yamazaki et al. | |
| 2014/0102764 A1* | 4/2014 | Fujino | C23C 14/3492 174/250 |

FOREIGN PATENT DOCUMENTS

| | | | |
|---|---|---|---|
| JP | WO 2012173192 A1 * | 12/2012 | ........... C23C 14/086 |
| KR | 10-2009-0040850 A | 4/2009 | |
| KR | 10-2010-0007605 A | 10/2009 | |
| KR | 10-2012-0013202 A | 1/2010 | |
| KR | 10-2012-0053480 A | 5/2012 | |
| KR | 10-2013-0105323 A | 9/2013 | |
| TW | 200923977 A | 6/2009 | |
| TW | 201243969 A1 | 11/2012 | |
| TW | 201246234 A1 | 11/2012 | |
| WO | 2012-067444 A2 | 11/2012 | |
| WO | WO 2012173192 A1 * | 12/2012 | ........... C23C 14/086 |

\* cited by examiner

【Fig. 1】 pre-crystallized

【Fig. 2】 post-crystallized

CONDUCTIVE STRUCTURE BODY PRECURSOR, CONDUCTIVE STRUCTURE BODY AND METHOD FOR MANUFACTURING THE SAME

TECHNICAL FIELD

This application is a 35 USC § 371 National Stage entry of International Application No. PCT/KR2014/011498 filed on Nov. 27, 2014, and claims priority to Korean Application No. 10-2013-0145567 Nov. 27, 2013, which are hereby incorporated by reference in their entireties for all purposes as if fully set forth herein. The present specification relates to a conductive structure body precursor, a conductive structure body and a method for manufacturing the same.

BACKGROUND ART

A touch screen panel is generally divided into as follows depending on the detection methods of signals. In other words, the type includes a resistive type sensing a location pressed by pressure through changes in a current or voltage value while a direct current voltage is applied, a capacitive type using capacitance coupling while an alternating current voltage is applied, and an electromagnetic type sensing a selected location as changes in a voltage while a magnetic field is applied.

Currently, a transparent ITO electrode has been commonly used in manufacturing a touch sensor. A transparent ITO electrode is commonly used in a screen unit of a touch sensor, and a metal having relatively small resistance is used in a wiring unit. As demand for a narrow bezel has recently increased, demand for a film depositing a metal on ITO has increased.

A narrow bezel relates to a trend of a metal wire width gradually decreasing as a touch screen is enlarged in a limited mobile device size, and the number of channels increases as a high-resolution screen becomes more generalized.

Figure 1:
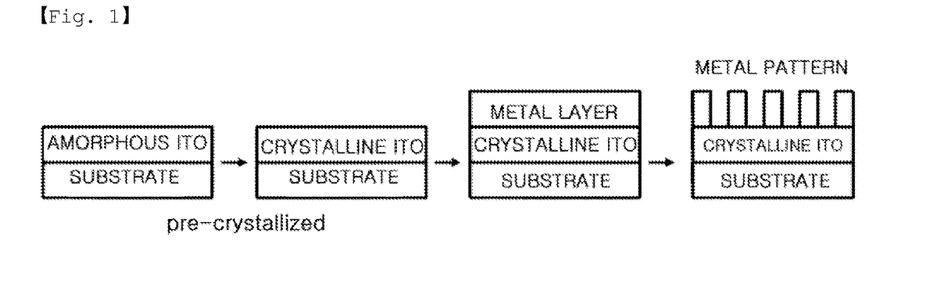
FIG. 1 is a mimetic diagram showing an ITO crystallization process according to an existing technology.

When a laminate including an ITO layer and a metal layer is manufactured, a method of crystallizing an ITO layer with the ITO layer being laminated on a substrate (PET), forming a metal layer on the crystallized ITO layer, and then patterning the metal layer is commonly used, as shown in FIG. 1.

PRIOR ART DOCUMENTS

Patent Documents

Korean Patent Application Laid-Open Publication No. 10-2010-0007605

DISCLOSURE

Technical Problem

An object of the present application is to provide a conductive structure body precursor, a conductive structure body and a method for manufacturing the same. Specifically, in manufacturing a conductive structure body including a transparent conductive layer and a metal layer, the inventors of present application provides a conductive structure body capable of a continuous process by forming a metal layer on an amorphous transparent conductive layer and then crystallizing the transparent conductive layer.

Technical Solution

One embodiment of the present application provides a conductive structure body precursor including a substrate; an amorphous transparent conductive layer provided on the substrate; and a metal layer provided on the amorphous transparent conductive layer.

In addition, one embodiment of the present application provides a method for manufacturing a conductive structure body including preparing a conductive structure body precursor including a substrate, an amorphous transparent conductive layer provided on the substrate, and a metal layer provided on the amorphous transparent conductive layer; and heat treating the conductive structure body precursor to crystallize the amorphous transparent conductive layer.

Furthermore, one embodiment of the present application provides a conductive structure body manufactured using the manufacturing method described above, and including a substrate; a crystallized transparent conductive layer provided on the substrate; and a metal layer provided on the crystallized transparent conductive layer.

In addition, one embodiment of the present application provides a touch screen panel including the conductive structure body.

Advantageous Effects

A conductive structure body according to one embodiment of the present application can efficiently crystallize a transparent conductive layer such as an ITO layer even after forming a metal layer on the transparent conductive layer such as an ITO layer. In addition, a metal layer can be formed on an amorphous layer prior to crystallizing a transparent conductive layer such as an ITO layer, therefore, the amorphous transparent conductive layer and the metal layer can be laminated through a roll to roll process, and as a result, the process can be simplified. Furthermore, by forming a metal oxide, a metal nitride or a metal oxy-nitride on an outermost layer of the conductive structure body, the amorphous transparent conductive layer provided at the bottom of the metal layer can be more readily crystallized.

MODE FOR DISCLOSURE

In the present specification, a description of one member being placed "on" another member includes not only a case of the one member adjoining the another member but a case of still another member being present between the two members.

In the present specification, a description of a certain part "including" certain constituents means capable of further including other constituents, and does not exclude other constituents unless particularly stated on the contrary.

Hereinafter, the present application will be described in more detail.

In the present specification, a display device is a term collectively referring to televisions, computer monitors or the like, and includes a display element forming an image and a case supporting the display element.

Examples of the display element include plasma display panels (PDP), liquid crystal displays (LCD), electrophoretic displays, cathode-ray tubes (CRT), OLED displays and the like. In the display element, an RGB pixel pattern for obtaining an image and an additional optical filter may be provided.

Meanwhile, relating to a display device, needs for a touch function in which a human hand directly becomes an input device without a separate input device such as a keyboard or a remote control have gradually increased as the propagation of smart phones, tablet PCs, IPTVs and the like has been accelerated. In addition, a multi-touch function capable of writing has been also required as well as specific point recognition.

Most touch screen panels (TSP) currently commercialized are based on a transparent conductive ITO thin film, but have problems such that a touch recognition speed becomes lower due to RC delay caused by relatively high surface resistance (minimum 150 Ω/□, ELECRYSTA product manufactured by Nitto Denko Corporation) of a transparent ITO electrode itself when used in a large-area touch screen panel, and an additional compensation chip needs to be introduced in order to overcome this.

In the case of a screen unit of a touch screen panel, a transparent ITO electrode is commonly used, and a metal having relatively small resistance (Ag, Cu and the like) is used in a wiring unit, and demand for a film depositing a metal on ITO has increased as demand for a narrow bezel has recently increased.

A narrow bezel relates to a trend of a metal wire width gradually decreasing as a touch screen is enlarged in a limited mobile device size, and the number of channels increases as a high-resolution screen becomes more generalized.

Existing methods use a 100 μm/100 μm (line width/line spacing) wire by screen printing an Ag paste, however, on demand for a narrow bezel, an exposure etching method needs to be used in order to obtain 30 μm/30 μm, and a micro line width is obtained by depositing a wire metal on an ITO film, then dry film resist (DFR) laminating the result, and then exposing and etching the pattern.

As the metal for deposition, Ag, Cu, Al and the like having excellent conductivity are normally used, however, particularly for Cu, which is weak against oxidation and corrosion, a structure of two or more layers are used by laminating a Ni alloy (Cu—Ni, Ni—Cr and the like) playing a role of oxidation and corrosion prevention layer.

An existing method for manufacturing a conductive structure body is schematically shown in FIG. 1.

As shown in FIG. 1, in existing technologies, amorphous ITO is formed on a substrate, and then the amorphous ITO is crystallized through a heat treatment process and the like. After that, a metal layer is formed on the crystallized ITO, and the metal layer is patterned using a photolithography method and the like. Such a method has an advantage in that properties of ITO are stably secured, however, the method has a problem in that facilities due to the heat treatment process of amorphous ITO are complex, and the process becomes complicated.

In view of the above, a method for manufacturing a conductive structure body according to one embodiment of the present application includes forming a metal layer on an amorphous transparent conductive layer and then heat treating the result to crystallize the transparent conductive oxide layer.

The method for manufacturing a conductive structure body according to one embodiment of the present application is capable of forming a metal layer on an amorphous layer prior to crystallizing a transparent conductive layer, therefore, the amorphous transparent conductive layer and the metal layer may be laminated through a roll to roll process, and consequently, the process may be simplified.

Figure 3:
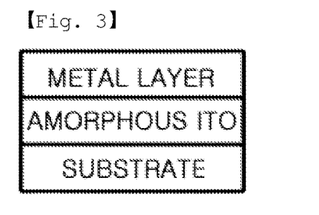
FIG. 3 is a diagram showing a structure of a conductive structure body precursor according to one embodiment of the present specification.

One embodiment of the present application provides a conductive structure body precursor including a substrate; an amorphous transparent conductive layer provided on the substrate; and a metal layer provided on the amorphous transparent conductive layer. FIG. 3 is a diagram showing a conductive structure body precursor according to one embodiment of the present application. Specifically, FIG. 3 shows a conductive structure body precursor provided with a substrate, amorphous ITO and a metal layer being laminated. The conductive structure body of the present application is not limited to the structure of FIG. 3, and additional layers may be further provided.

In the present specification, the conductive structure body precursor means becoming a conductive structure body by crystallizing the amorphous transparent conductive layer. In other words, the conductive structure body precursor means a state prior to the crystallization of a conductive structure body.

According to one embodiment of the present application, the conductive structure body precursor may further include a metal oxide layer, a metal nitride layer or a metal oxy-nitride layer, and the metal oxide layer, the metal nitride layer or the metal oxy-nitride layer may be provided on the metal layer.

One embodiment of the present application provides a method for manufacturing a conductive structure body including preparing a conductive structure body precursor including a substrate, an amorphous transparent conductive layer provided on the substrate, and a metal layer provided on the amorphous transparent conductive layer, and heat treating the conductive structure body precursor to crystallize the amorphous transparent conductive layer.

According to one embodiment of the present application, the step of preparing a conductive structure body precursor may include preparing a substrate; forming an amorphous transparent conductive layer on the substrate; and forming a metal layer on the amorphous transparent conductive layer.

In the manufacturing method according to one embodiment of the present application, the conductive structure body precursor may be the same as the conductive structure body precursor described above.

According to one embodiment of the present application, the substrate is not particularly limited, and materials known in the art may be used. For example, glass, a plastic substrate, a plastic film and the like may be used, however, the substrate is not limited thereto.

According to one embodiment of the present application, the amorphous transparent conductive layer may include one or more types selected from the group consisting of amorphous indium oxide, amorphous zinc oxide, amorphous indium tin oxide, amorphous indium zinc oxide and amorphous transparent conductive polymers, but is not limited thereto.

According to one embodiment of the present application, the thickness of the amorphous transparent conductive layer may be greater than or equal to 15 nm and less than or equal to 20 nm, but is not limited thereto.

According to one embodiment of the present application, the amorphous transparent conductive layer may be formed through a deposition process or a printing process using materials for the amorphous transparent conductive layer described above.

According to one embodiment of the present application, the metal layer may include one or more types selected from the group consisting of copper (Cu), aluminum (Al), silver (Ag), neodymium (Nd), molybdenum (Mo), nickel (Ni), and an alloy including two or more of these.

According to one embodiment of the present application, the metal layer may be formed using methods known in the art. For example, methods such as evaporation, sputtering, wet coating, vaporization, electroplating or electroless plating and metal foil lamination may be used for the formation.

According to one embodiment of the present application, the metal layer may also be formed using a printing method. When the metal layer is formed using a printing method, an ink or paste including a metal may be used, and the paste may further include a binder resin, a solvent, a glass frit and the like in addition to the metal.

According to one embodiment of the present application, the thickness of the metal layer may be greater than or equal to 0.01 μm and less than or equal to 30 μm. When the thickness of the metal layer is within the above range, more superior effects in terms of conductivity of the metal layer and economic feasibility of the pattern forming process may be obtained.

According to one embodiment of the present application, a step of forming a metal oxide layer, a metal nitride layer or a metal oxy-nitride layer on the metal layer may be further included prior to the step of heat treatment.

According to one embodiment of the present application, the metal oxide layer, the metal nitride layer or the metal oxy-nitride layer may include an oxide, a nitride or an oxy-nitride of a metal selected from the group consisting of copper (Cu), aluminum (Al), silver (Ag), neodymium (Nd), molybdenum (Mo), nickel (Ni), and an alloy thereof.

According to one embodiment of the present application, the metal layer, and the metal oxide layer, the metal nitride layer or the metal oxy-nitride layer may include the same metal. When considering an etching process for patterning afterword, the metal layer, and the metal oxide layer, the metal nitride layer or the metal oxy-nitride layer including the same metal has an advantage of saving process costs since etching may be carried out at once.

According to one embodiment of the present application, the metal oxide layer, the metal nitride layer or the metal oxy-nitride layer may be formed using methods known in the art. For example, methods such as evaporation, sputtering, wet coating, vaporization, electroplating or electroless plating and metal foil lamination may be used for the formation.

According to one embodiment of the present application, the metal oxide layer, the metal nitride layer or the metal oxy-nitride layer may also be formed using a printing method. When the metal oxide layer, the metal nitride layer or the metal oxy-nitride layer is formed using a printing method, an ink or paste including a metal oxide, a metal nitride or a metal oxy-nitride may be used, and the paste may further include a binder resin, a solvent, a glass frit and the like in addition to the metal oxide, the metal nitride or the metal oxy-nitride.

According to one embodiment of the present application, the thickness of the metal oxide layer, the metal nitride layer or the metal oxy-nitride layer may be greater than or equal to 5 nm and less than or equal to 80 nm, but is not limited thereto.

According to one embodiment of the present application, by forming the metal oxide layer, the metal nitride layer or the metal oxy-nitride layer on the metal layer, efficiency of a heat treatment process carried out for crystallizing the amorphous transparent conductive layer afterword may be enhanced.

According to one embodiment of the present application, the step of heat treatment may use a heat treatment process using an infrared (IR) lamp. More specifically, according to one embodiment of the present application, the heat treatment process using an infrared lamp is a method using far infrared as a source, and is a heat treatment process capable of heating when material absorption occurs in a wavelength region of 2 μm or greater. Crystallization of the amorphous transparent conductive layer may be carried out through such an effect.

According to one embodiment of the present application, the step of heat treatment may use a far infrared (FIR) heater, and this may use a method of controlling an atmospheric temperature inside the heater using far infrared generated by an infrared (IR) lamp source. Specifically, far infrared heats up air inside the heater, and the air of which temperature is raised circulates by a blower inside, and the temperature is controlled in this manner.

According to one embodiment of the present application, the step of heat treatment may be carried out at a temperature of greater than or equal to 100° C. and less than or equal to 180° C.

According to one embodiment of the present application, specific conditions of the step of heat treatment may be determined by those skilled in the art depending on the condition such as a material and a thickness of the amorphous transparent conductive layer.

According to one embodiment of the present application, the step of heat treatment may be carried out using a method of irradiating infrared on the metal layer or a method of irradiating infrared at the bottom of the substrate. Herein, in terms of crystallization of the amorphous transparent conductive layer, the process of heat treating the amorphous transparent conductive layer is preferably carried out using a method of irradiating infrared on the metal layer.

The metal layer has high reflectivity with respect to infrared, and no absorption occurs in a long wavelength region of infrared, therefore, when irradiating infrared on the metal layer, there is a concern that the heat treatment function may decline due to infrared reflection of the metal layer. Accordingly, in the present application, it is more preferable to use a method in which the metal oxide layer, the metal nitride layer or the metal oxy-nitride layer is formed on the metal layer, and infrared is irradiated on the metal oxide layer, the metal nitride layer or the metal oxy-nitride layer as described above. Herein, the metal oxide layer, the metal nitride layer or the metal oxy-nitride layer not only enhances corrosion resistance of the metal layer, but also improves efficiency of crystallizing the amorphous transparent conductive layer at the bottom of the metal layer by absorbing infrared during the heat treatment process.

Figure 2:
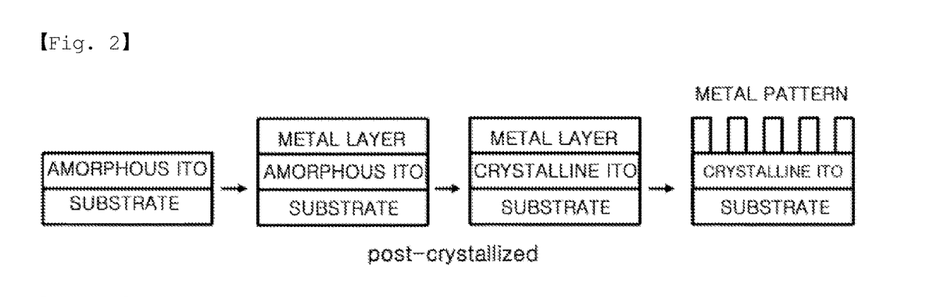
FIG. 2 is a mimetic diagram showing an ITO crystallization process according to one embodiment of the present specification.

FIG. 2 shows a mimetic diagram of a process according to the embodiment described above. In FIG. 1, which shows an existing technology, ITO crystallization is carried out prior to forming a metal layer on ITO, while, in a method according to the embodiment of the present specification of FIG. 2, ITO crystallization is carried out after forming a metal layer on ITO. ITO is shown as an example in FIG. 2, however, the scope of the present invention is not limited thereto, and ITO may be replaced with a transparent conductive material in need of crystallization.

In the method described above, the transparent conductive layer prior to crystallization by heat treatment is amorphous. In the transparent conductive layer, resistance in a pre-crystallization state prior to heat treatment, that is, an amorphous state, and resistance in a crystallized state after heat treatment, that is, a crystalline state, may be controlled by conditions and compositions during the manufacturing process depending on the material. For example, when the transparent conductive layer is an ITO layer, the resistance prior to crystallization and after crystallization is controlled by the oxygen inflow fraction and the ITO target constituent content when ITO is deposited using, for example, a sputter. Accordingly, in the present specification, the term "amorphous" and "crystalline" may be identified by its resistance. Those skilled in the art may identify the resistance in an amorphous state and resistance in a crystalline state dependent on materials.

According to one embodiment of the present application, by forming a metal layer on an amorphous transparent conductive layer and then heat treating and crystallizing the amorphous transparent conductive layer, a continuous roll to roll (R2R) process may be used when forming the metal layer immediately after forming the amorphous transparent conductive layer, and a user or provider may crystallize the amorphous transparent conductive layer through heat treatment, therefore, there is an advantage in that the process may be simplified.

According to one embodiment of the present application, the step of heat treatment may be irradiating infrared light on the metal oxide layer, the metal nitride layer or the metal oxy-nitride layer.

Figure 5:
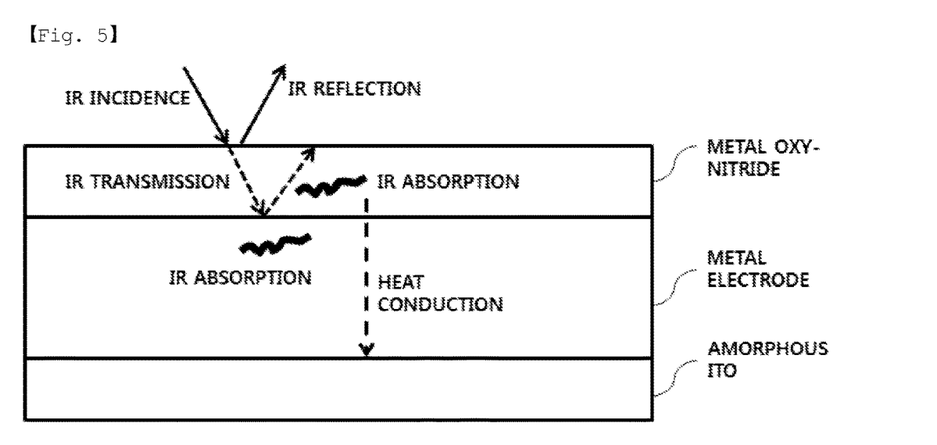
FIG. 5 schematically shows heat conduction flow during a heat treatment process in a method for manufacturing a conductive structure body as one embodiment of the present application.

As one embodiment of the present application, heat conduction flow during a heat treatment process in the method for manufacturing a conductive structure body is schematically shown in FIG. 5. A metal oxy-nitride is illustrated as a layer provided on the metal layer in FIG. 5, however, a metal oxide layer and a metal nitride layer may also be used. In addition, ITO is shown as an example in FIG. 5, however, the scope of the present invention is not limited thereto, and ITO may be replaced with a transparent conductive material in need of crystallization. Specifically, when a metal oxide layer, a metal nitride layer or a metal oxy-nitride layer is provided on a metal layer in FIG. 5, infrared energy may be more favorably transferred to a transparent conductive layer compared to a case in which infrared directly enters to a metal layer.

According to one embodiment of the present application, the metal oxide layer, the metal nitride layer or the metal oxy-nitride layer minimizes energy reflected by the metal layer in the step of heat treatment, and plays a role of favorably transferring energy to an amorphous transparent conductive layer.

According to one embodiment of the present application, an additional metal oxide layer, an additional metal nitride layer or an additional metal oxy-nitride layer may be further provided between the substrate and the metal layer.

According to one embodiment of the present application, patterning the metal layer may be further included after the step of heat treatment.

According to one embodiment of the present application, patterning the metal layer, and the metal oxide layer, the metal nitride layer or the metal oxy-nitride layer may be further included after the step of heat treatment.

According to one embodiment of the present application, processes of patterning the metal layer, and the metal oxide layer, the metal nitride layer or the metal oxy-nitride layer may be carried out as a separate process, or carried out at the same time.

According to one embodiment of the present application, the pattern line width of the patterned metal layer may be greater than 0 μm and less than or equal to 50 μm, and greater than 0 μm and less than or equal to 30 μm, but is not limited thereto. In addition, according to one embodiment of the present application, the metal oxide layer, the metal nitride layer or the metal oxy-nitride layer may have the same pattern shape with the metal layer.

According to one embodiment of the present application, the pattern size of the metal oxide layer, the metal nitride layer or the metal oxy-nitride layer does not have to be completely the same as the pattern of the metal layer, and a case in which the pattern line width of the metal oxide layer, the metal nitride layer or the metal oxy-nitride layer is narrower or wider than the pattern line width of the metal layer is also included in the scope of the present application. Specifically, according to one embodiment of the present application, the pattern line width of the metal oxide layer, the metal nitride layer or the metal oxy-nitride layer may be from 80% to 120% of the pattern line width of the metal layer. Alternatively, according to one embodiment of the present application, an area equipped with a pattern in the metal oxide layer, the metal nitride layer or the metal oxy-nitride layer may be from 80% to 120% of an area equipped with a pattern in the metal layer. Even more specifically, a pattern shape of the metal oxide layer, the metal nitride layer or the metal oxy-nitride layer is preferably a pattern shape having the same or a lager pattern line width compared to a pattern line width of the metal layer.

One embodiment of the present application provides a conductive structure body manufactured using the method for manufacturing a conductive structure body.

Specifically, one embodiment of the present application provides a conductive structure body manufactured using the method for manufacturing a conductive structure body, and including a substrate; a crystallized transparent conductive layer provided on the substrate; and a metal layer provided on the crystallized transparent conductive layer.

Figure 4:
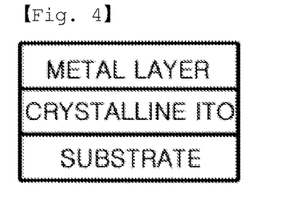
FIG. 4 is a diagram showing a structure of a conductive structure body according to one embodiment of the present specification.

FIG. 4 illustrates one example of the structure of the conductive structure body. FIG. 4 illustrates a conductive structure body in which a substrate, crystallized ITO and a metal layer are laminated in consecutive order, and ITO is shown as an example in FIG. 4, however, the scope of the present invention is not limited thereto, and ITO may be replaced with a transparent conductive material in need of crystallization. In addition, according to one embodiment of the present application, a metal oxide layer, a metal nitride layer or a metal oxy-nitride layer may be further provided on a metal layer in the structure of FIG. 4.

According to one embodiment of the present application, the conductive structure body includes a crystallized transparent conductive layer on a substrate, and a metal layer on the crystallized transparent conductive layer. In addition, the conductive structure body may include a metal oxide layer, a metal nitride layer or a metal oxy-nitride layer on the metal layer. Furthermore, the metal layer, and the metal oxide layer, a metal nitride layer or a metal oxy-nitride layer may be patterned layers.

According to one embodiment of the present application, the transparent conductive layer may include an amorphous area.

When the method for manufacturing a laminate containing a metal layer and a crystallized transparent conductive layer described above is used for the manufacture, crystallization of the transparent conductive layer is carried out by heat treatment while the metal layer is provided on the transparent conductive layer, therefore, an amorphous area may be present in the transparent conductive layer compared to a case crystallizing a transparent conductive layer not provided with a metal layer.

According to one embodiment of the present application, a residual compressive stress size of the crystallized transparent conductive layer may be smaller than residual compressive stress of a transparent conductive layer crystallized by heat treatment without the metal layer.

Specifically, as the residual compressive stress (Gpa), residual compressive stress increases as crystal grains become larger during a crystallization process of an amorphous transparent conductive layer. However, when a conductive structure body is manufactured using the method described above, an amorphous region is present in some regions due to the presence of a metal layer, therefore, residual compressive stress may be smaller than a case crystallizing a transparent conductive layer without a metal layer.

Table 1 shows the measurement results of residual compressive stress when ITO is crystallized without a metal layer, and when a metal layer formed with Cu is provided on ITO.

TABLE 1

| | Slope | Gpa |
|---|---|---|
| Amorphous ITO | −0.00934 | −0.80 |
| ITO Crystallized without Metal Layer (Pre-crystallized ITO) | −0.00736 | −0.63 |
| ITO Crystallized while Metal Layer is Provided (Post-crystallized ITO) | −0.00836 | −0.72 |

The residual compressive stress of Table 1 is obtained using a difference between the deflection degree of beam irradiated to the transparent conductive layer through X-ray irradiation, and an intrinsic coefficient of the transparent conductive layer material. Specifically, when compressive or tensile stress is not applied on the transparent conductive layer, the irradiated X-ray beam is present outside the transparent conductive layer. However, when compressive or tensile stress is applied on the transparent conductive layer, the shape of inside materials slightly changes, and therefore, the irradiated beam is present on the transparent conductive layer when X-ray is irradiated differing irradiation angles. Based on the degree of changes herein, residual compressive stress may be obtained using a difference from an intrinsic coefficient of materials forming the transparent conductive layer such as Young's modulus.

Figure 6:
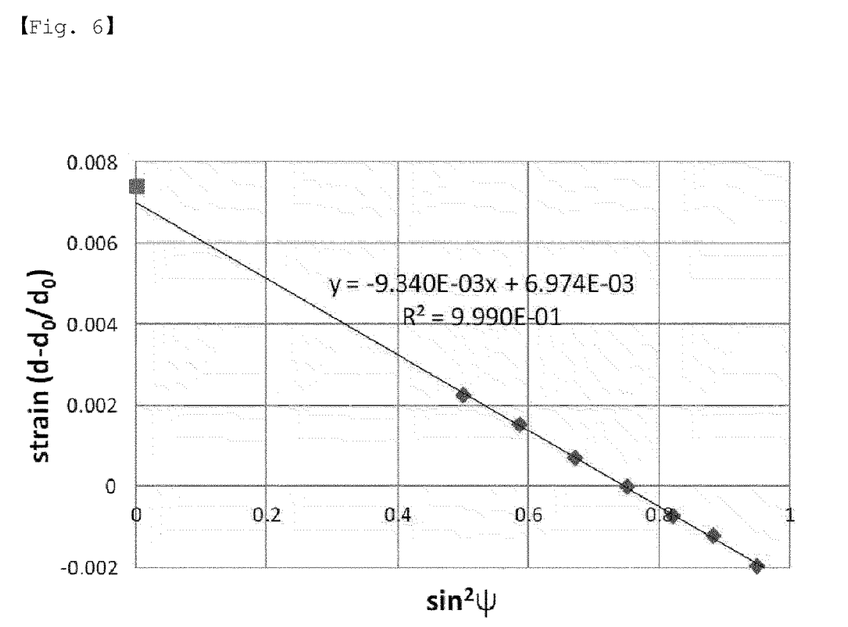
FIG. 6 is a graph measuring residual compressive stress of amorphous ITO of Table 1.

FIG. 6 is a graph measuring residual compressive stress of amorphous ITO of Table 1.

Figure 7:
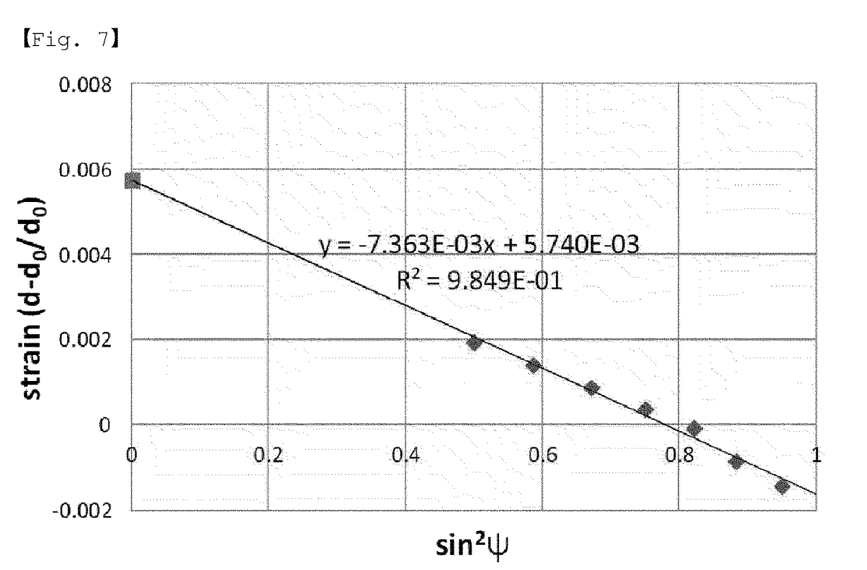
FIG. 7 is a graph measuring residual compressive stress of pre-crystallized ITO of Table 1.

FIG. 7 is a graph measuring residual compressive stress of pre-crystallized ITO of Table 1.

Figure 8:
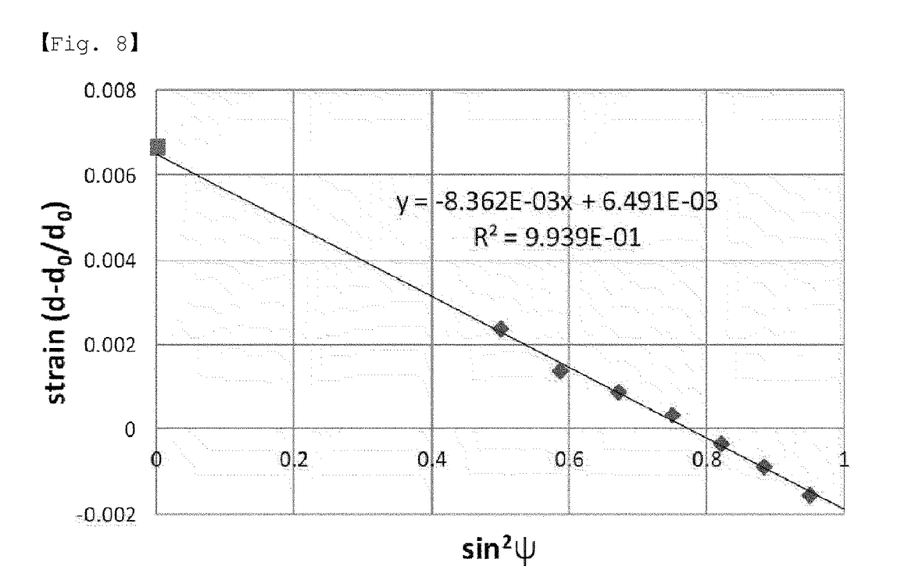
FIG. 8 is a graph measuring residual compressive stress of post-crystallized ITO of Table 1.

FIG. 8 is a graph measuring residual compressive stress of post-crystallized ITO of Table 1.

As seen from the results of Table 1, it can be seen that ITO crystallized without a metal layer has larger residual compressive stress compared to ITO crystallized after providing a metal layer.

One embodiment of the present application provides a touch screen panel including the conductive structure body. For example, in a capacitive type touch screen panel, the conductive structure body according to one embodiment of the present application may be used as a touch sensitive electrode substrate. Particularly, the conductive structure body is more preferably used in a wiring unit such as a bezel unit in a touch screen panel, however, the use is not limited thereto.

The touch screen panel according to one embodiment of the present application may further include an additional structure body besides the conductive structure body described above. In this case, the two structure bodies may be disposed in the same direction, or the two structure bodies may be disposed in the opposite direction. When two or more structure bodies are included, an insulation layer may be provided therebetween. Herein, the insulation layer may additionally have a function of an adhesion layer.

The touch screen panel according to one embodiment of the present application may include a lower substrate; an upper substrate; and an electrode layer provided on any one or both sides of the surface of the lower substrate adjoining the upper substrate and the surface of the upper substrate adjoining the lower substrate. The electrode layers may each have a function of X axis location detection and Y axis location detection.

Herein, one or both of the electrode layers provided on the lower substrate and the surface of the lower substrate adjoining the upper substrate; and the electrode layer provided on the upper substrate and the surface of the upper substrate adjoining the lower substrate may be the conductive structure body according to one embodiment of the present application described above.

When two electrode layers are formed by providing electrode layers on one surface of both the upper substrate and the lower substrate, an insulation layer or a spacer may be provided between the lower substrate and the upper substrate so that a constant distance is maintained between the electrode layers and connection does not occur. The insulation layer may include an adhesive or a UV or heat curable resin. The insulation layer may include an adhesive or a UV or heat curable resin. The touch screen panel may further include a ground connection unit connected to the pattern of the conductive layer in the conductive structure body described above. For example, the ground connection unit may be formed on the edge portion of a surface on which the pattern of the conductive layer of the substrate is formed. In addition, at least one of an anti-reflection film, a polarizing film, a fingerprint resistance film may be provided on at least one surface of a laminate including the conductive structure body. Other types of functional films may be further included besides the functional films described above depending on design specifications. Such a touch screen panel may be used in a display device such as an OLED display panel, a liquid crystal display (LCD), a cathode-ray tube (CRT) and a PDP.

One embodiment of the present application provides a display device including the conductive structure body. In the display device, the conductive structure body according to one embodiment of the present application may be used in a color filter substrate, a thin-film transistor substrate or the like.

One embodiment of the present application provides a solar cell including the conductive structure body. For example, a solar cell may include an anode electrode, a cathode electrode, a photoactive layer, a hole transfer layer and/or an electron transfer layer, and the conductive structure body according to one embodiment of the present application may be used as the anode electrode and/or the cathode electrode.

The conductive structure body may substitute existing ITO in a display device or a solar cell, and may have a potential application in flexible products. In addition, the conductive structure body may be used as a next-generation transparent electrode together with a CNT, a conductive polymer, graphene and the like.

Hereinafter, the present application will be described in detail with reference to examples, comparative examples and experimental examples. However, the following examples are for illustrative purposes only, and the scope of the present invention is not limited thereto.

EXAMPLE

Example 1

The state of ITO was an amorphous state immediately after forming an ITO film, and after forming a metal electrode layer through sputtering using this film at room temperature, a conductive structure body was manufactured through a reactive sputtering step forming an oxide or nitride relatively stable to infrared (IR) absorption or high temperature and high humidity on the uppermost layer by injecting a reactive gas such as oxygen or nitrogen.

More specifically, a conductive structure body having a structure of amorphous ITO/Cu (~100 nm)/CuOx(40 nm to 60 nm) was manufactured.

After passing 20 M of the film in a roll state as the manufactured conductive structure body through R2R far infrared IR at 145° C. for approximately 25 minutes, the degree of crystallization of the lower ITO was determined through testing, and the results are shown in the following Table 2.

The degree of crystallization of the lower ITO may be determined by measuring the resistance of the ITO revealed after removing the upper metal using an etchant. Herein, the ITO is primarily determined to be crystallized when the resistance shows a resistance value of crystallized ITO, however, regarding the determination of whether sufficient crystallization is carried out or not, it may be decided that crystallization is insufficient when the resistance value increases when the ITO is additionally immersed in the etchant. The reason is that sufficiently crystallized ITO is not much reacted to a metal etchant and thereby does not experience a significant resistance increase.

TABLE 2

| Location (MD) | | Measurement Value Immediately after Cu Strip (L, C, R Average Value (TD)) | | | After Over-etched for 4 Minutes |
|---|---|---|---|---|---|
| | | Transmittance (%) | H (%) | Surface Resistance (Ω/□) | Surface Resistance (Ω/□) |
| IR Heat Treated at 145° C. for 25 Minutes | 5M | 90.8 | 0.7 | 153 | 158 |
| | 10M | 90.8 | 0.7 | 155 | 154 |
| | 15M | 90.8 | 0.7 | 152 | 155 |
| | 20M | 90.8 | 0.7 | 150 | 158 |
| No Heat Treatment | | 88.5 | 0.8 | 270 | 1,050 |

As seen from the results of Table 2, the ITO surface resistance immediately after the metal strip was measured to be approximately 150 Ω/□, surface resistance of crystalline ITO, in the experimental results, and the surface resistance was also approximately 150 Ω/□ when measured after additionally immersing (4 minutes) the ITO in a Cu etchant, therefore, it may be determined that the lower ITO was sufficiently crystallized. However, when IR heat treatment was not carried out, it can be seen that the surface resistance was measured to be approximately 270 Ω/□, surface resistance of amorphous ITO, and the surface resistance increased to approximately 1,050 Ω/□ after additional immersion since the amorphous ITO was etched by a Cu etchant.

Figure 9:
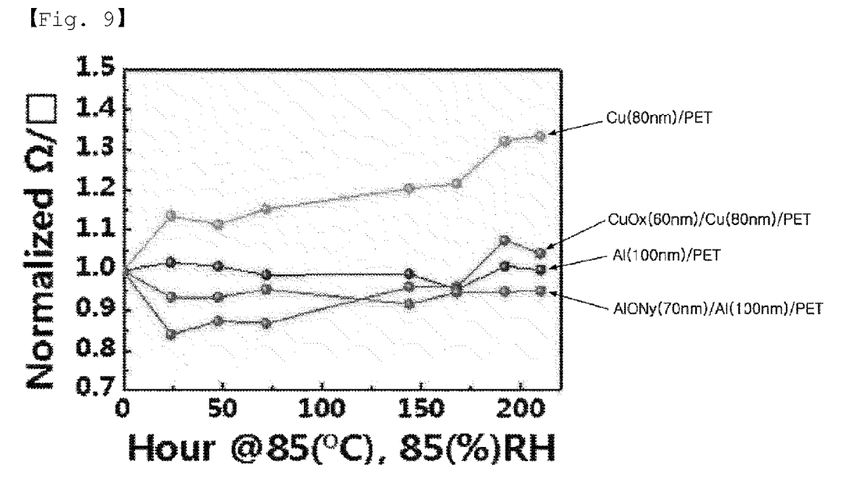
FIG. 9 shows a surface resistance value of a conductive structure body according to one embodiment of the present application.

The surface resistance value of the conductive structure body according to one embodiment of the present application was shown in FIG. 9.

When light such as IR was irradiated on a certain material, reflection (R), transmission (T) and absorption (A) occur in the material, and the sum needs to be 100% from the viewpoint of energy. According to FIG. 9, a pure metal (Al or Cu) does hardly transmit IR and reflects most of it, therefore, the absorption (A) factor relating to a temperature increase hardly exists. In this case, there is no temperature increase effect due to IR absorption of metal, and crystallization does not favorably occur since heat source required for the crystallization of lower ITO may not be provided, however, in the cases such as CuOx or AlOxNy, certain absorption occurs in an IR region, and this leads to a temperature increase of materials, and as a result, energy required for lower ITO crystallization may be provided through conduction.

The invention claimed is:

1. A method for manufacturing a conductive structure body comprising:
    preparing a conductive structure body precursor including a substrate, an amorphous transparent conductive layer provided on the substrate, and a metal layer provided on the amorphous transparent conductive layer;
    heat treating the conductive structure body precursor to crystallize the amorphous transparent conductive layer; and
    forming a metal oxide layer, a metal nitride layer or a metal oxy-nitride layer on the metal layer prior to the step of heat treating the conductive structure body precursor,
    wherein,
        the metal oxide layer, the metal nitride layer or the metal oxy-nitride layer is formed using a sputtering method, and wherein the step of heat treating the conductive structure body precursor is irradiating infrared light on the metal oxide layer, the metal nitride layer or the metal oxy-nitride layer, wherein the metal oxide layer, the metal nitride layer or the metal oxy-nitride layer includes an oxide, a nitride or an oxy-nitride of a metal selected from the group consisting of copper (Cu), aluminum (Al), silver (Ag), neodymium (Nd), molybdenum (Mo), nickel (Ni), and an alloy thereof, and wherein a thickness of the metal oxide layer, the metal nitride layer or the metal oxy-nitride layer is greater than or equal to 40 nm and less than or equal to 60 nm.

2. The method for manufacturing a conductive structure body of claim 1, wherein the metal layer, and the metal oxide layer, the metal nitride layer or the metal oxy-nitride layer include the same metal.

3. The method for manufacturing a conductive structure body of claim 1, wherein the step of heat treating the conductive structure body precursor uses an infrared (IR) lamp.

4. The method for manufacturing a conductive structure body of claim 1, wherein the step of heat treating the conductive structure body precursor is carried out at a temperature of greater than or equal to 100° C. and less than or equal to 180° C.

5. The method for manufacturing a conductive structure body of claim 1, further comprising patterning the metal layer after the step of heat treating the conductive structure body precursor.

6. The method for manufacturing a conductive structure body of claim 1, further comprising patterning the metal layer, and the metal oxide layer, the metal nitride layer or the metal oxy-nitride layer after the step of heat treatment.

* * * * *